United States Patent
Madrid et al.

(10) Patent No.: US 7,402,462 B2
(45) Date of Patent: Jul. 22, 2008

(54) FOLDED FRAME CARRIER FOR MOSFET BGA

(75) Inventors: Ruben P. Madrid, Lapu-lapu (PH); Marvin Gestole, Lapu-lapu (PH); Erwin Victor R. Cruz, Koronadal (PH); Romel N. Madatad, Mandaue (PH); Arniel Jaud, Mandaue (PH); Paul Armand Calo, Cebu (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 387 days.

(21) Appl. No.: 11/179,348

(22) Filed: Jul. 12, 2005

(65) Prior Publication Data

US 2007/0015316 A1 Jan. 18, 2007

(51) Int. Cl.
  *H01L 21/50* (2006.01)
  *H01L 21/48* (2006.01)
  *H01L 21/44* (2006.01)
  *H01L 23/495* (2006.01)

(52) U.S. Cl. ............ 438/123; 438/121; 438/122; 257/666; 257/676; 257/E23.031; 257/E23.059

(58) Field of Classification Search ............. 438/123, 438/121, 122; 257/666, 676, E23.031, E23.059
See application file for complete search history.

(56) References Cited

U.S. PATENT DOCUMENTS

| 6,133,634 | A | 10/2000 | Joshi | |
|---|---|---|---|---|
| 6,784,537 | B2 * | 8/2004 | Moriguchi | 257/706 |
| 6,879,033 | B2 * | 4/2005 | Hosoya | 257/699 |
| 6,893,901 | B2 | 5/2005 | Madrid | |
| 7,122,884 | B2 * | 10/2006 | Cabahug et al. | 257/676 |
| 2002/0167075 | A1 | 11/2002 | Madrid | |

* cited by examiner

*Primary Examiner*—Luan Thai
(74) *Attorney, Agent, or Firm*—Hiscock & Barclay, LLP; Thomas R. FitzGerald, Esq.

(57) ABSTRACT

A folded frame carrier has a die attach pad (DAP) 30 and one or more folded edges 32, 33, 34, 35. Each folded edge has one or more studs 36 and each stud has a trapezoidal tip. The folded frame carrier may be made of single gauge copper or copper alloy. Multiple folded frame carriers may be formed between opposite rails of a lead frame. The folded edges are cut with a relief groove. The tips are formed in edges of the DAP and then the tips are folded upright. The tips provide electrical connection to the terminal on the rear surface of a power semiconductor mounted on the DAP.

26 Claims, 9 Drawing Sheets

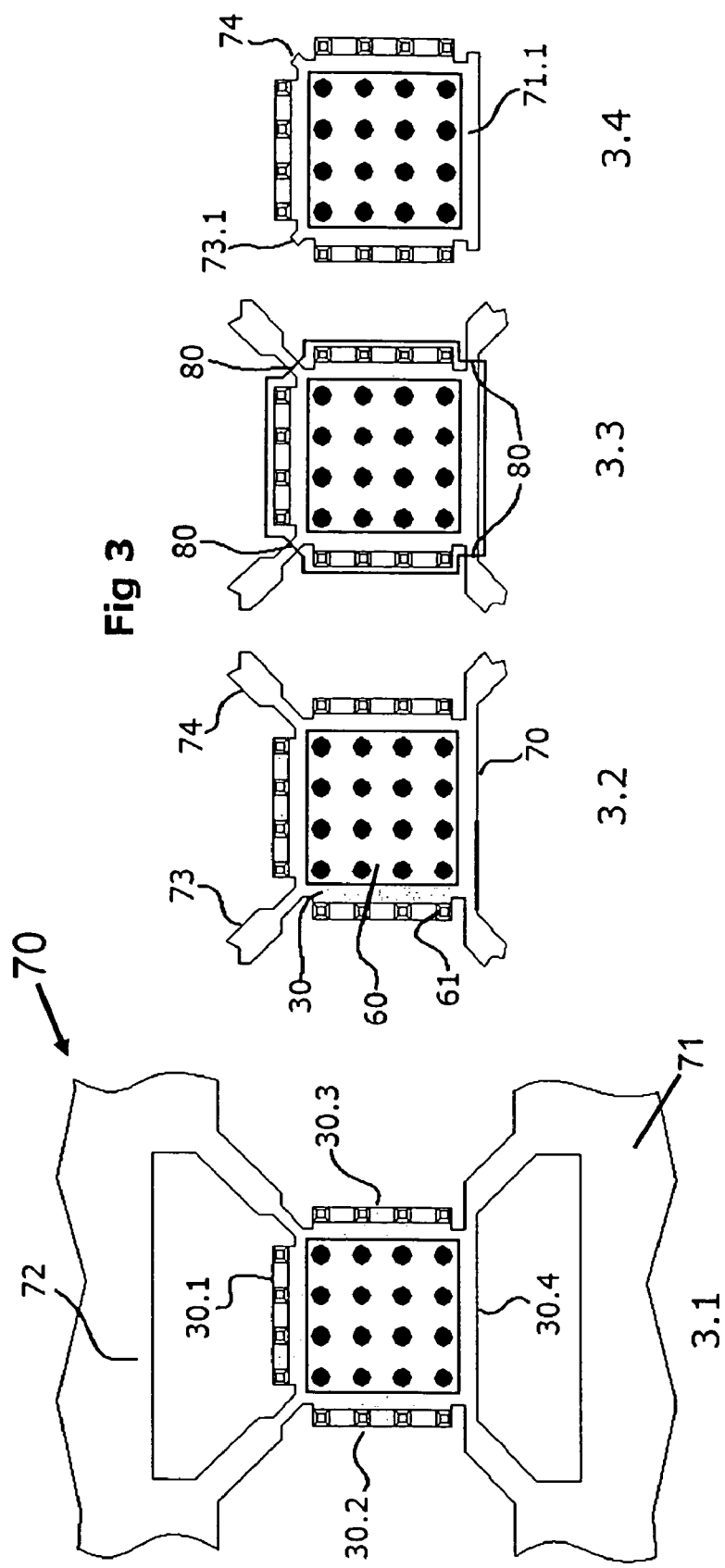

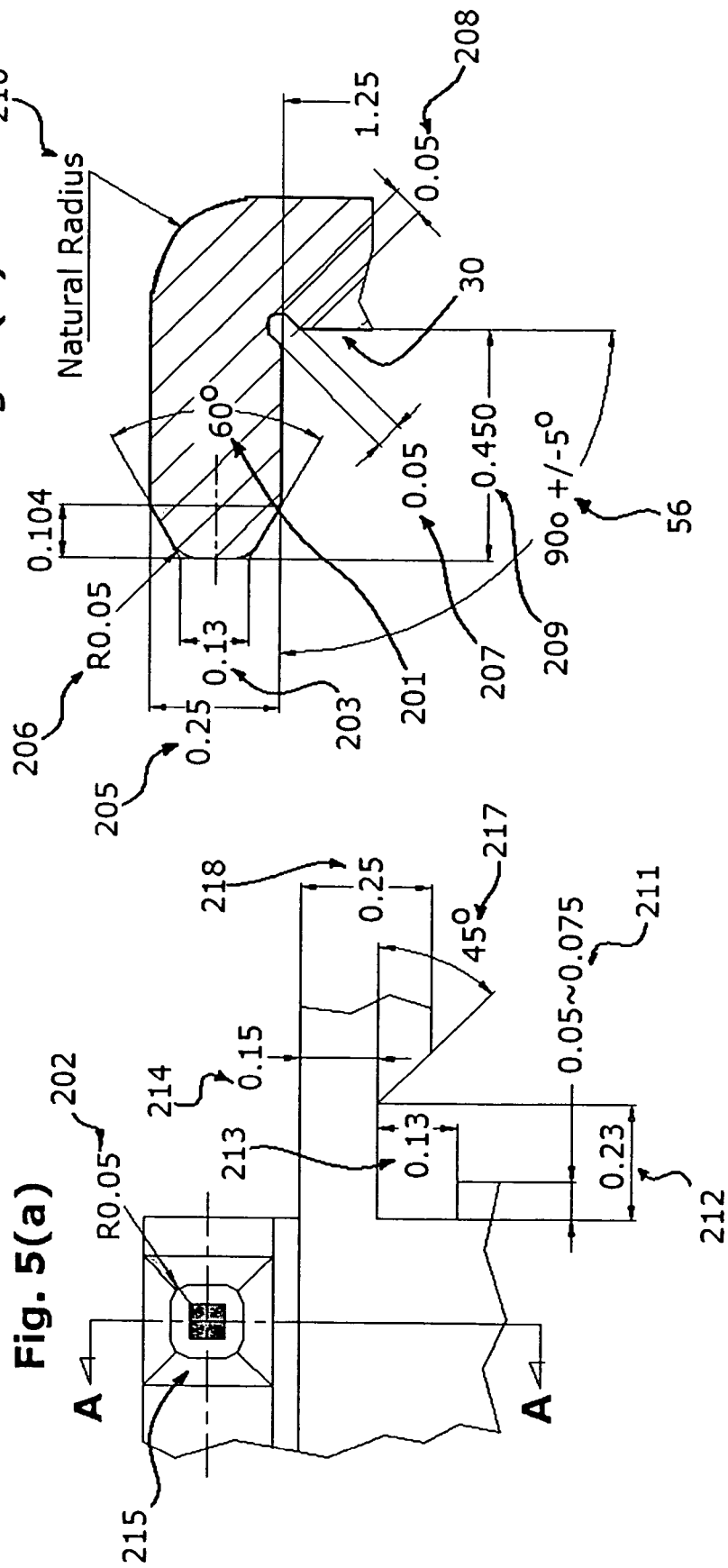

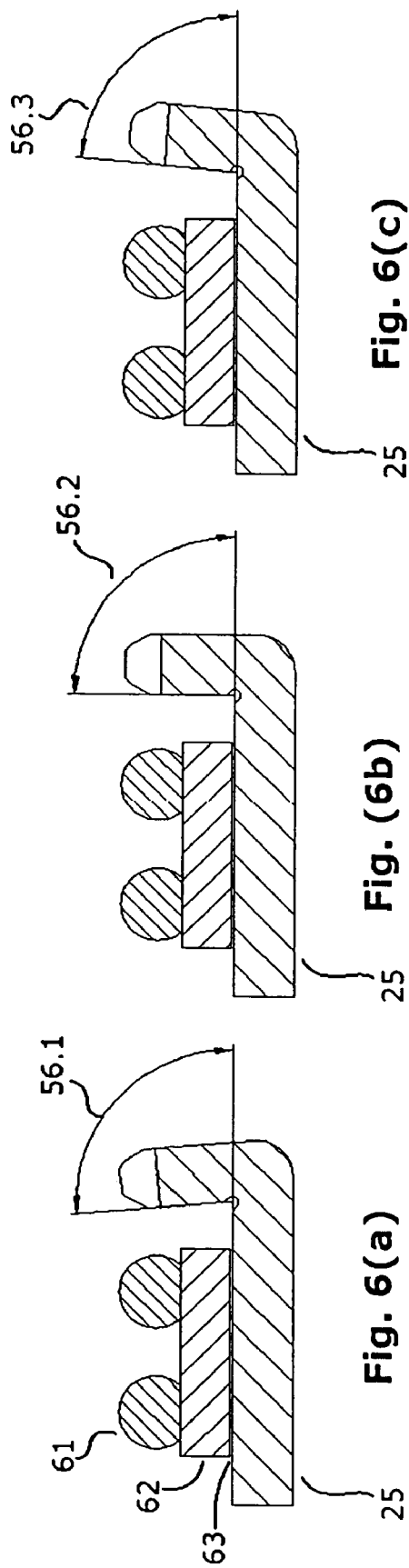

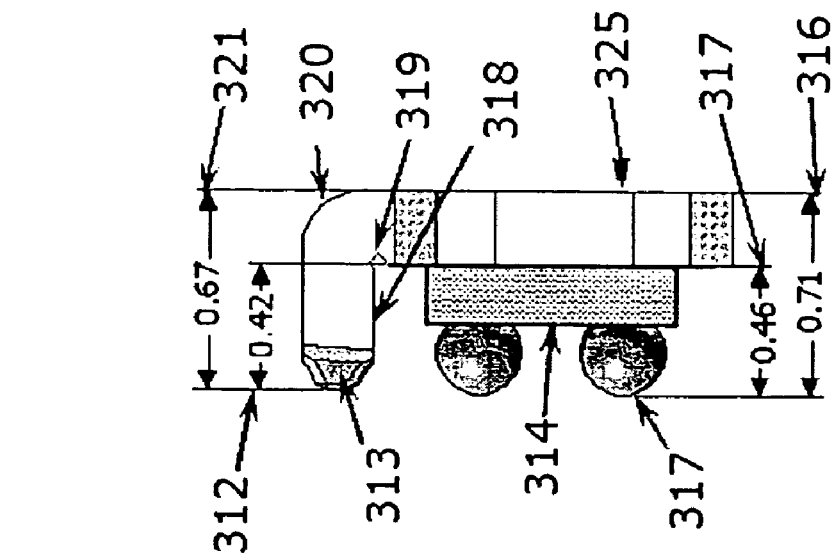
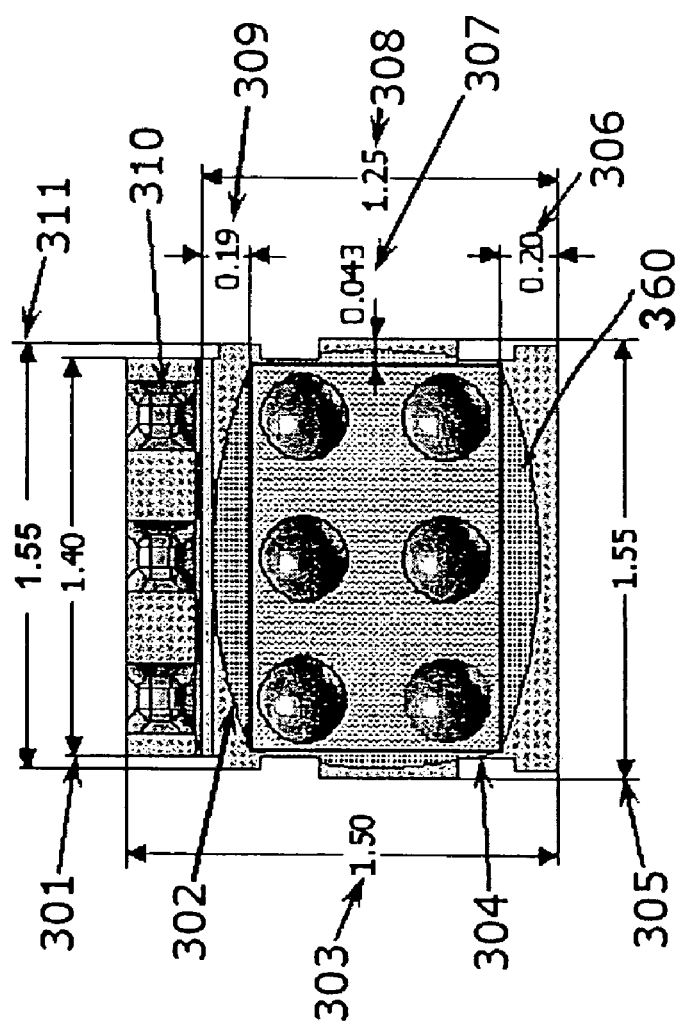
Fig. 7(b)
Fig. 7(a)

FOLDED FRAME CARRIER FOR MOSFET BGA

BACKGROUND

Packaging semiconductors is the final step taken in the manufacturing process before the semiconductor is ready for use. Packaging is costly because it requires individually handling semiconductor dies. While many have proposed system-on-chip solutions that would integrated multiple functions into one die, the vast majority of semiconductor devices are still individually packaged.

Electronic systems assemble the integrated circuits on a printed circuit board. They provide the necessary high voltage and high current required to operate motors, speakers and other real world devices. In a typical electronic system, power semiconductors and integrated circuit are soldered to printed circuit boards. Circuit traces on the boards provide connections among the devices and connections to the external world. A popular packaging technique for power semiconductors is a ball grid array (BGA) of contacts for the source regions and the gate and a carrier cover that connects to the drain side of the power semiconductor to bring the drain contact to the same plane as the source and gate contacts. In that way the power device has all its contacts in one plane and those contacts may be readily soldered to a printed circuit board.

A method that can be used to form a BGA package is the solder ball attach process. In a solder ball attach process, solder balls are mechanically placed on a ball land pattern of conductive regions in a semiconductor carrier as well as the semiconductor substrate. After the solder balls are placed on the specified ball land pattern, the semiconductor die is flipped over and is mounted on a circuit substrate.

The solder balls typically have a lead-based solder alloy. For example, the solder alloy may be a near eutectic tin-lead (Sn—Pb) alloy that melts at about 183.degree. C. When the solder balls are present between the semiconductor die and the circuit substrate, the balls are heated to a temperature at or below the melting temperature of the solder alloy. The purpose of heating the balls below melting point is to ensure that the solder balls do not collapse. The solder balls are fluxed and re-flowed to join the circuit substrate to the semiconductor die. During fluxing, oxides in the solder are removed and the conductive surfaces of the semiconductor die and the circuit substrate are wet with the melting solder. After fluxing and re-flow, solder interconnects are formed between the semiconductor die and the circuit substrate. The formed solder interconnects electrically couple the circuit substrate and the semiconductor die together.

FIG. 8 shows one prior art semiconductor die package. In the die package, a carrier 100 is provided with a rectangular cavity 100-1 that receives a semiconductor die 102. In this example, the semiconductor die comprises a vertical metal oxide field effect transistor (MOSFET) and is in a Ball Grid Array-type package (BGA). An array of solder balls 108 is on the surface of semiconductor die 102 as well as on an edge surface 106 of the carrier 100. The solder ball array 108 is divided into two groups. A first outer array of solder balls 108-2 connects to the carrier edge surface 106 and an internal array of solder balls 108-1 connects to the die surface. The array of solder balls 108 can be mounted and coupled to a circuit substrate such as a circuit board.

The outer array of solder balls 108-2 provides the connection to the drain terminal of the MOSFET, while the inner array of solder balls 108-1 provides the connection to the source and gate terminals of the MOSFET. A corner solder ball 108-3 can be dedicated for the gate terminal and the remaining solder balls 108-1 in the inner array 108-1 provide for a distributed, low resistance connection to the source terminal of the BGA MOSFET.

Solder ball technology could be enhanced and improved to provide for a more robust design. For example, the strength of adhesion of the ball interconnects could be improved. Solder interconnects formed using a ball attach process can break if they are weak. If one or more solder interconnects fail in a die package, the entire package can be inoperative. In addition, during processing (e.g., during reflow), the solder balls deform. The deformation can cause the solder balls in the array to have varying heights. As a result, the ends of the solder balls may not be coplanar with each other. If, for example, some of the solder balls on an array of conductive pads are taller than other solder balls in the array, the shorter solder balls may not make contact with both the semiconductor die and the circuit substrate. The formed die package could be inoperative due to the faulty solder interconnects. Also, solder balls can move during processing. If the solder balls move from their intended locations, the desired interconnections may not be formed in the semiconductor die package. Lastly, many solder balls contain lead. Lead is not an environmentally friendly substance. It would be desirable to reduce if not to eliminate the amount of lead used in a semiconductor die package.

In U.S. Pat. No. 6,893,901 is an improvement invention that has metal bumps formed in the metal layer of the lead frame that also has a die pad for carrying the power semiconductor. Its entire disclosure is incorporated herein by reference. The bumps can be formed by stamping a metal layer. Any suitable stamping apparatus may be used to form the bumps such as a stamping machine having multiple stamping elements (sometimes referred to as stamping tools), and a corresponding stamping die. The stamping die has recesses that are configured to receive the multiple stamping elements. In an exemplary process, a metal layer is placed on the stamping die. The stamping elements punch the metal layer while it is on the stamping die. During punching, the stamping elements push portions of the metal layer into the recesses of the stamping die without passing through the metal layer. The pressure applied to the metal layer deforms portions of the metal layer to form multiple stamped bumps in the metal layer. This stamping process can be repeated so that sets of bumps are formed in the metal layer. After stamping the sets of bumps, multiple carriers are formed. The formed carriers can be separated from each other after the semiconductor dies are assembled to the individual carriers to form individual packages. The separated packages can be mounted to a circuit substrate such as a circuit board. In some embodiments, the carrier can be considered a "lead frame" that electrically couples a semiconductor die to a circuit substrate such as a circuit board. See FIG. 9.

The structure and process shown in that application require a dual gauge lead frame and heavy metal working equipment for coining the die pad and for punching contact studs in the periphery of the carrier. Thus, there remains substantial room for improving upon the prior art and the prior invention.

SUMMARY

This invention provides a method for packaging a semiconductor die and a packaged semiconductor die that are less expensive and more reliable than prior art methods and packaged die. It provides a single gauge folded lead frame with folded, studded edges for carrying the drain contact from the back side of a power mosfet to a plane parallel a ball grid array } on the front surface of the mosfet. The ball grid array has contacts to the source and gate regions. The method begins with providing a lead frame with a planar portion of a single thickness. The lead frame has a die pad and one or more tie bars that hold the die pad to side rails. The method forms studs along one edge of the planar portion of the lead frame. The studs will be electrically and mechanically connected to the drain of a power mosfet. In particular, one or more edges of the die pad are cut to form edges with flat projections extending from the die pad in the same plane as the die pad. The flat projections are then shaped into studs with tapered tips, preferably tips having a trapezoidal shape. The studs are shaped by conventional metal working or stamping machines. Next a bending groove is formed in the surface of the die pad adjacent each studded edge. The bending groove is relatively shallow. Then the studded edge is folded upright to have the studs extend transverse to the plane of the die pad. The bending operation is performed in two or more steps in order to minimize the stress in the lead frame material. When the studded edges are in their upright position, the tips of the studs are spanked to set the tips in a common plane.

The method summarized above thus provides a folded flip chip packaged semiconductor device with a die attach pad that has a planar surface for holding a power mosfet or other such device. An adhesive or solder layer on the planar surface holds the die on the die pad. At least one wall along one edge of the die attach pad has a plurality of tapered studs that extend transversely from the plane of the die attach pad for carrying an electrical connection to the back side of the power mosfet to a plane on the other side of the power semiconductor that includes a ball grid array of source and gate contacts. Each studded wall has a relief groove that enables the wall to bend upright.

DRAWINGS

FIG. 3 is series of steps showing how tie bars connecting the die pad to the side rails are removed.

Figure 4B:
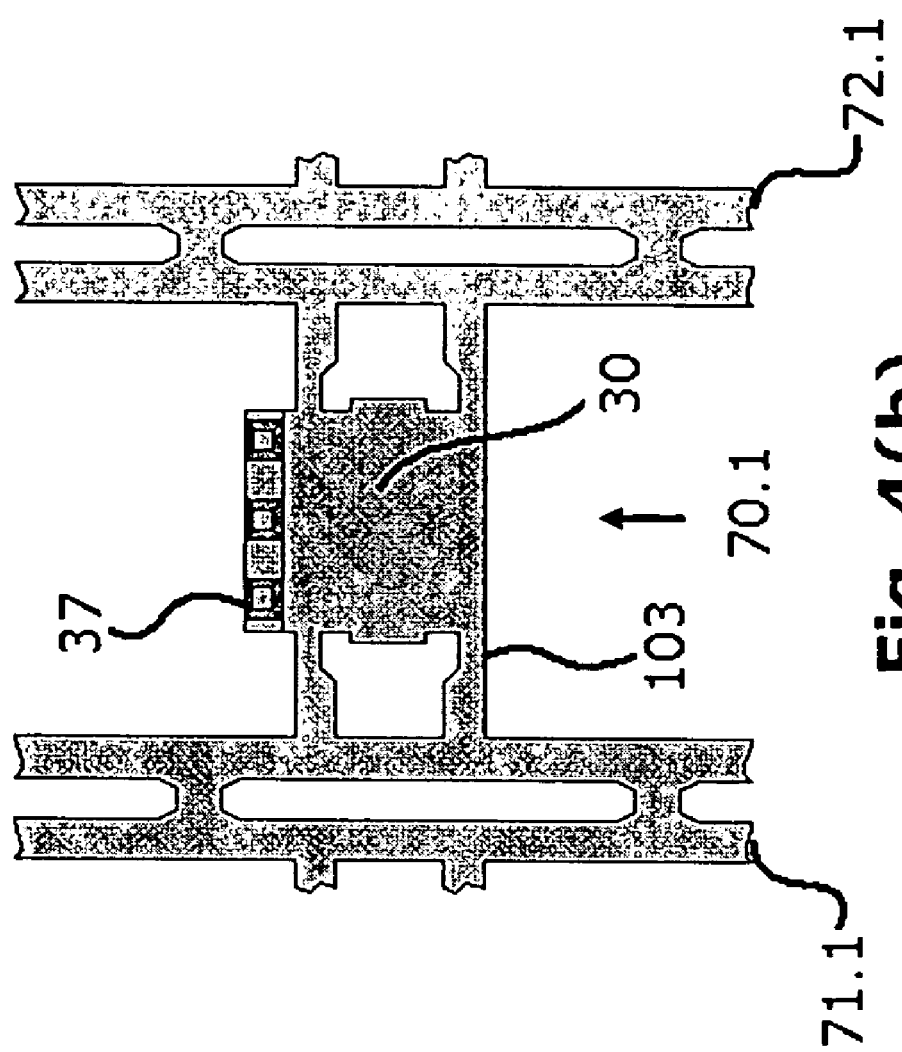
Figure 4A:
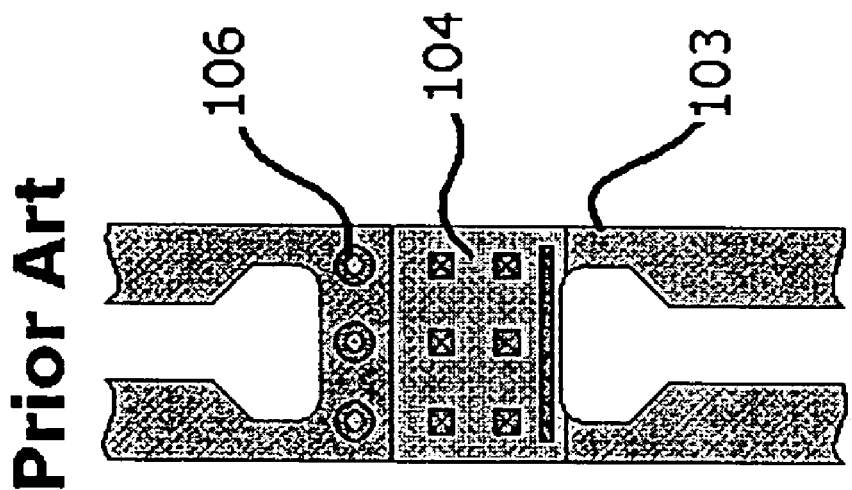

FIGS. 4(a) and 4(b) are comparative planar view of a prior art single sided lead frame and a single sided lead frame made in accordance with the invention.

FIGS. 5(a) and 5(b) are planar and cross section views of a single sided folded package.

FIGS. 6 (a), (b) and (c) are views of a folded lead frame with a studded edge at one of three angles.

FIGS. 7(a) and 7(b) show a partial plan view of one stud and a cross section view of a stud, respectively.

Figure 8:
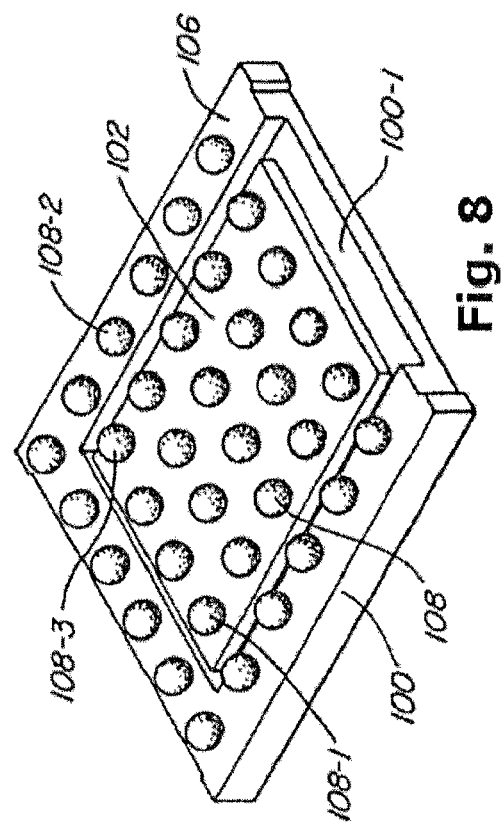

FIG. 8 is a perspective view of one prior art package.

Figure 9:
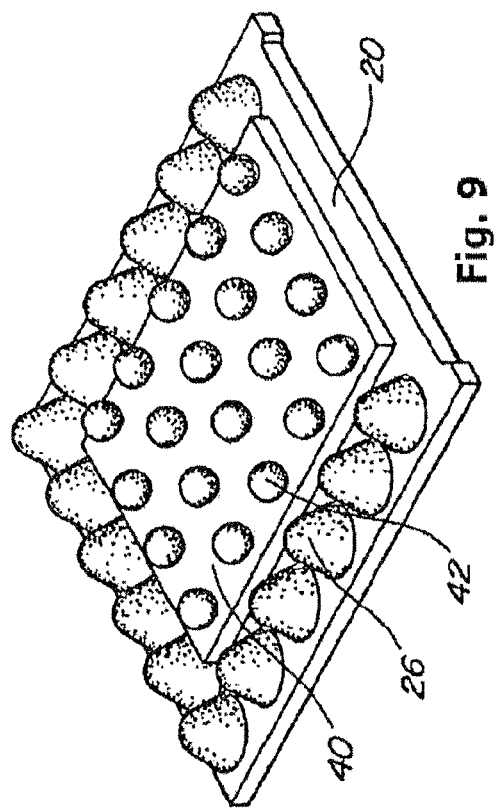

FIG. 9 is a perspective view of another prior art package.

Figure 10:
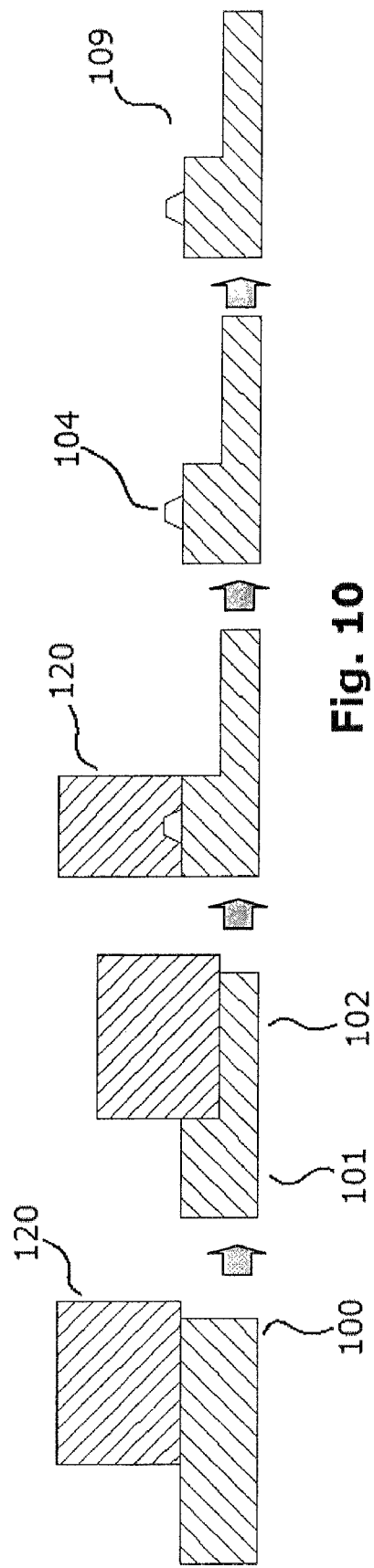

FIG. 10 is a process flow for the package of FIG. 9.

DETAILED DESCRIPTION

Figure 1:
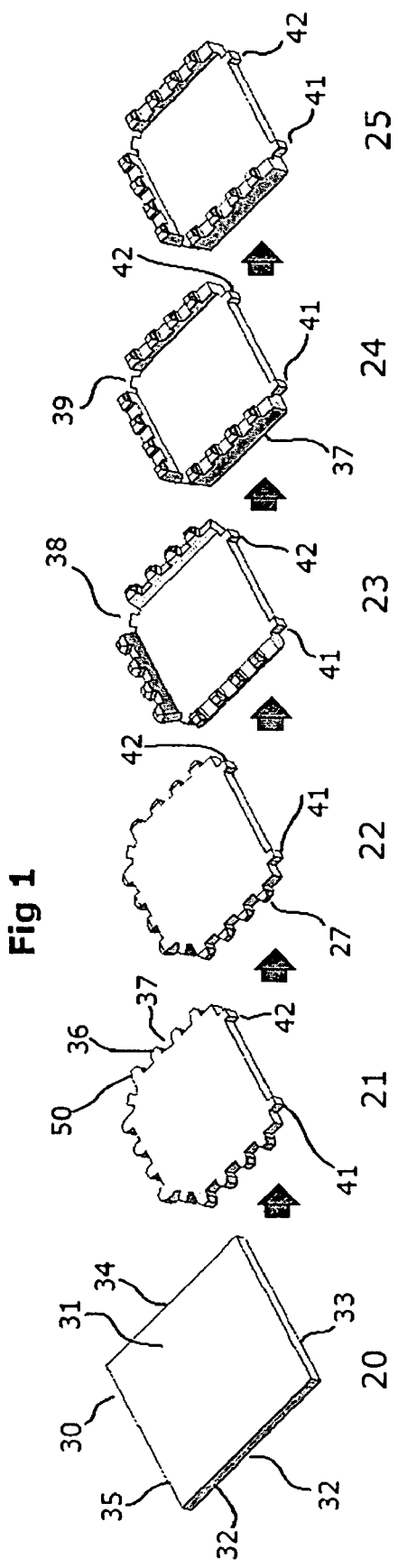
FIG. 1 shows a series of steps for forming a folded lead frame with three studded sides.

Turning now to FIG. 1, there is shown a die attach pad (DAP) 30. It is customarily connected to a lead frame, but the connecting structure is omitted in order to better illustrate the metal forming process. That process begins in step 20 where the DAP 30 is provided with an upper surface 31, a lower surface 32, and four edges 32, 33, 34, 35.

In the next step 21, the edges are trimmed to form a number of flat projections 36 separated from each other by spaces 37. In the embodiment of FIG. 1, three edges 32, 34 and 35 are formed into flat projections 36. The remaining edge 33 is also trimmed into a pair of tie bars 41, 42 that connect the DAP 30 to the lead frame (not shown). One of the flat projections is shown in more detail in FIG. 2, step 50. The projection 36 has a solid rectangular elongated structure that terminates in a planar surface 60 which is substantially transverse to upper and lower surfaces 31, 32 of DAP 30.

Figure 2:
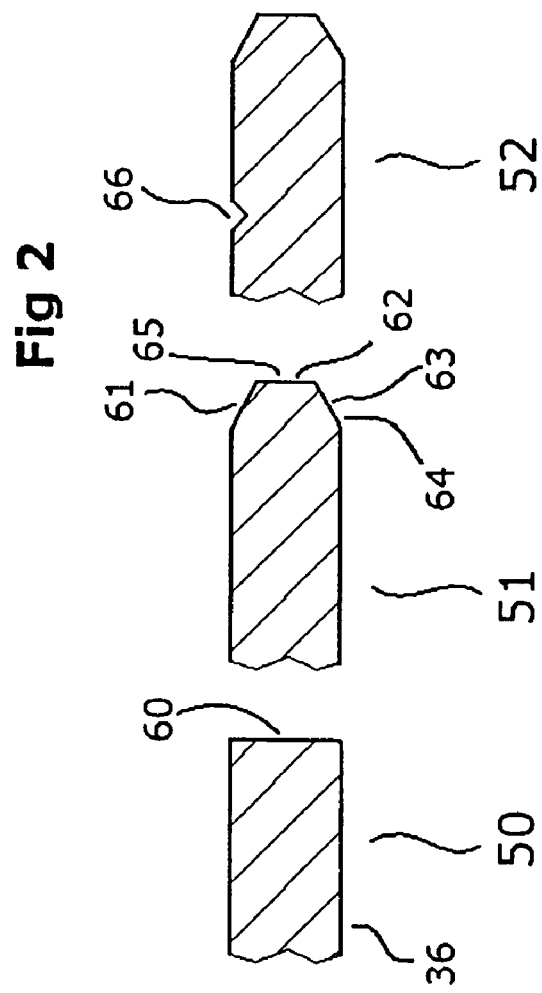
FIG. 2 shows a series of steps for metal working the tips of a flat projection into an upright trapezoidal stud in a folded lead frame.

Returning to FIG. 1, the next step 22 forms a trapezoidal tip on the top of the projections 36. FIG. 2 shows the trapezoidal tip in more detail. The edges of the sides of the projection proximate the tip 60 are formed by a machine to assume an angle that is disposed inward and inclined toward the center axis of the projection 36. This step is shown in more detail as step 51 in FIG. 2. Note that each wall of the projection 36 proximate the tip 60 is sloped to an angle that inclines toward an axis parallel to the length of the stud 36. Step 51 shows how the upper and lower surfaces 61, 63 near the tip 65 are inclined and those skilled in the art understand that the other two surfaces 62, 64 are likewise inclined. The inclined surfaces 61, 62, 63, 64 terminate on a reduced tip surface 65, thereby forming a trapezoidal-shaped stud tip. In the preferred embodiment the stud 36 has a square cross-section in a plane taken perpendicular to its central axis. Of course, the stud could have a rectangular cross-section and still provide a trapezoidal-shaped tip. If the stud had another shaped cross-section, one could still provide an inclined planar surface to taper the elongated walls of the stud to the tip. Thus, three, four, five or more circumferential stud surfaces are considered within the scope of this invention.

Those skilled in the art understand that the trapezoidal stud tips are formed in the edges of the die pad 30. The forming operation uses metal working tools and dies to shape the tips of the studs into the desire trapezoidal shape. As such, only a very small portion of the metal of the die pad 30 is subjected to the shaping operation. In addition the shaping operation shapes the studs in the same plane as the plane of the die pad 30. This type of metal working operation is easier to perform than prior art operations which extrude metal into die cavities that are transverse to the plane of the die pad 30.

During the tip forming step the tip 60 and the four corners of the trapezoid are rounded. See FIGS. 5(a) and 5(b). The exemplary stud 202 has the following characteristics. The stud 202 may have a square base 215 of about 0.25×0.25 mm or a rectangular base of 0.20×0.25 mm. The tie bar has a length 212 about 0.23 mm and its initial width 214 is about 0.15 mm and its final width 218 is 0.25 mm. The relief width 213 is about 0.20 mm and the relief depth 211 is about 0.05 to 0.075 mm. The tie bar angle 217 is 45 about degrees.

The foregoing gives at least one specific example of the interrelationship of the measurements to each other. Thus, the height of the stud is between one and two times the thickness of the lead frame. The base of the stud is square or rectangular and at least two sides are the same length as the thickness of the lead frame. The depth and width of the relief groove are each about 2% of the thickness of the lead frame. The flat portion 203 of the tip is a square region that has a perimeter about half the perimeter of the base of the tip and an area that is between 20-40 percent of the size of the area of the base. They above and other relative relationship are readily ascertained by those skilled in the art.

The height of the stud 209 is about 0.450 with a tolerance of plus "zero" mm and minus 0.035-mm above the die pad 30. The trapezoidal angle 201 is about 60 degrees. The corners of faces of the trapezoidal surfaces are rounded, preferably with a radius of curvature 202 of 0.05 mm. The folded stud angle 56 is between 85 and 95 degrees. The corner relief depth 208 and width 207 are about 0.05 mm. The tip of the stud has a square flat surface approximately 0.13 mm on each side. The flat surface is formed during the spanking operation. As such, the stud tip 202 present a tapered profile leading to a small flat surface that makes it easily soldered to a circuit board.

After the forming step, the DAP 30 undergoes first and second bending steps 23, 24. Prior to bending, a groove, preferably a v-groove 66, is machined into the surface 31 of the DAP 30. See step 52 of FIG. 2 for more details of the groove 66. In the first bending step (23, FIG. 1; 53, FIG. 2) the trapezoidal tip is bent to a first angle 67. That angle is about 45 degrees. The second angle 68 of steps 24, 54 is about 90 degrees. It is preferred to bend the stud 36 in two or more steps in order to give the metal in the stud 36 time to adjust to the strain caused by bending. If the stud were bent in one step to an angle of 90 degrees, the stud might break at the bend. Those skilled in the art understand that as the stud 36 is bent, those portions proximate the v-groove are compressed and the portions distal from the v-groove and near the lower surface 63 are under tension. This creates internal stress in the metal and too quick a bend to 90 degrees cause the metal to fail at the bend.

It is difficult to fold a stud to 90 degrees. The metal of the lead frame has certain resilience and tends to spring back during the bending process. As such, provision is made for accepting a bend within at least 90 degrees of nominal. In a preferred embodiment, the nominal bend is chosen to be 90 degrees. See angle 56.2 in FIG. 6 (b). With a six degree freedom of manufacture, the angle may be between 95 degrees as by angle 56.1 in FIGS. 6(a) and 85 degrees as shown by angle 56.3 in FIG. 6(c).

Returning to FIG. 1, the final step 25 is a spanking step. As part of this step the tops 65 of the trapezoidal tips 36 are lightly tapped to remove any residual burrs on them and to arrange the tips of the studs in a common plane. Spanking is a well controlled process. It does not apply excess stress to the upright studs. However, if the studs do tend to bend during spanking, it is within the skill of those familiar with the art to provide supports on at least two opposite sides of the studs so that the studs are supported during spanking. Theses supports (not shown) will reduce or prevent buckling of the studs.

The invention may be employed with one, two or three edges of the DAP 30 formed into studs. It is possible to form four edges with studs. However, one must remember that the purpose of the studded edge is to provide electrical contact to an electrode on the bottom of the semiconductor die 60. For almost all applications, three studded edges are sufficient to provide good electrical contact to the backside of the die 60. In many applications a single studded edge is sufficient. The following description will explain how to use the invention to achieve a three edge studded package and a one edge studded package. A two edge studded package could be made by using the three sided method and not forming an edge on one side or by modifying the one sided package to form a second studded edge.

Turning to FIGS. 3.1-3.4, there is shown one embodiment of the invention that has a lead frame 70 with one or more DAPs 30. Each DAP 30 has three edges containing bent studs 36. The DAPs 30 are attached to side rails 71, 72. A pair of tie bars 73, 74 connects two corners of the DAP 30 to side rail 72. Note that there is space between the edge 30.1 and the side rail 72. The opposite edge 30.4 is coextensive with the other side rail 71. The pattern of DAP 30 connected between side rails 71, 72 is repeated for a series of DAPs 30 and as many as six or more DAPs 30 may be located between a pair of side rails 71, 72 in a lead frame 70. The semiconductor device 60 is affixed to the center portion 31 of the DAP 30. The surface 65 of the semiconductor device 60 includes a common contact. Typically the common contact is the drain of a mosfet or the collector of a bipolar transistor. The other surface of the device 60 includes an array of ball or studs 61. In the case of a mosfet, most of the balls or studs are connected to source regions and at least one ball or stud is connected to a gate. For a bipolar device most of the balls or studs would be connected to emitter regions and at least one ball or stud would be connected to a base region on the surface of the device 60.

FIG. 3.2 is a partial view corresponding to FIG. 3.1 but where the side rails are not shown. In a next step shown in FIG. 3.3, the residual DAP and device 60 are identified in an outline 80. In the following step, a suitable trimming machine cuts the tie bars 73, 74 from side rail 72 and cuts the unwanted portion of side rail 71 from the DAP 30 to leave the singulated DAP 30 with device 60 as shown in FIG. 3.4. The singulated DAP 30 and device 60 are ready for flip chip mounting on a printed circuit board or may be individually packaged.

Turning to FIGS. 4(a)-4(b), they compare a prior art single sided bump on a lead frame 103 with a single studded edge package of the invention on another lead frame 70.1. The prior art combination has a DAP 104 and punched bumps 60 on one edge of the DAP 104. The prior art device has integral rails and the space between sequential DAPs 104 are where the DAPs are separated from each other. The inventive package has two distinct side rails 71.1 and 72.1 with the DAP 30 extending between the two rails while supported by four tie bars. After a die is affixed to the DAP 30, a singulation machine cuts the tie bars between the side rails 71.1, 72.1 and the DAP 30. Then a pick and place machine retrieves the DAP 30 and places it on a printed circuit board where it is soldered in place.

A finished folded frame 300 with die 314 and a single side trapezoidal edge 310 is show in FIGS. 7(a) and 7(b). The folded stud wall 301 has a width of about 1.45 mm and the entire package width 311 is about 1.550 mm. A solder paste formation 302 holds the die 360 on the die pad 325. The package 300 has a length 303 of about 1.550 mm. The length 308 of the die pad 314 is about 1.25 mm. The package 300 has a width 305 of about 1.55 mm. The distance 312 of the tip of the stud to the DAP surface is about 0.42 mm and the overall height of the package 321 is about 0.67 mm. The stud tip has a radius 313 of about 0.05 mm. The solder bumps 315 have a diameter of about 300 μm. The overall package height 317 is about 0.71 mm. The combined height of the die 314 and the ball grid array is about 0.46 mm.

In general a single sided folded package is sufficient for smaller die such as the one shown in FIGS. 5(a) and 5(b). However, larger size dies often require a two or three sided studded folded wall to provide reliable electrical connection of the rear terminal of the die to the circuit board and to reliably mechanically attach the folded package to the circuit board.

The method and apparatus of the invention have superior economic benefits when compared to the stamping, coining and punching method used to create prior art packages. The following discussion will compare a prior art process and apparatus shown the invention.

An exemplary prior art stamping operation is shown in FIG. 10. The stamping apparatus can comprise a stamping machine having multiple stamping elements (sometimes referred to as stamping tools, not shown), and a corresponding stamping die 120. The stamping die has recesses that are configured to receive the multiple stamping elements. In an exemplary process, a metal layer 100 is placed on the stamping die. The stamping elements punch the metal layer while it is on the stamping die. During punching, the stamping elements push portions of the metal layer into the recesses of the stamping die without passing through the metal layer. The pressure applied to the metal layer deforms portions of the metal layer to form multiple stamped bumps in the metal layer. This stamping process can be repeated so that sets of bumps are formed in the metal layer. In particular, prior art lead frame 100 has two gauges: 101 portion is about 0.75 mm for the stud section and 102 portion is about 0.33 mm for final die pad thickness. The 0.75 mm material is deeply coined to form a die pad portion with a thickness of 0.33 mm and an edge portion 102 of the original thickness. Next the thicker portion 101 is punched to form conical suds 104 that protrude above the surface of the thicker portion 101 of the lead frame. That creates the final product 109.

In contrast, the invention may begin with a lead frame that is less than 0.75 mm and may be as thin as 0.25 mm. The invention thus provides both a uniform thickness for the entire lead frame and also requires less material. For corresponding lead frames in both the prior art the invention, the invention requires only one third the material needed by the prior art. In material costs alone, the invention reduces the cost of materials by 66%. While the material cost of any one package is very small, when the material costs are multiplied by the millions of packages typically produced each year by even small manufacturers, the cost savings for a manufacturer are very significant.

The invention is also easier to fabricate. The deep coining process performed on the prior art lead frame required a high tonnage coining and stamping apparatus. In contrast, lighter weight trim-and-form machines are sufficient to form the folded lead frame of the invention.

Another advantage of the invention is that its die pad is not stamped or otherwise thinned or contacted. The use of a single gauge material renders a finished, mounted semiconductor device that is more robust than the prior art device. In contrast, the prior art deforms relatively large regions of the prior art lead frame to make a die pad that is thinner than the edge studs, The stamping and coining of the prior art die pad may crack the pad.

We believe that stamping and coining sets up internal stress in the die pad material. During further process or testing steps the lead frame may be heated or cooled and that can release the internal stress. When the stress releases, the die may disengage from the die pad. Analysis of some failed parts show that the die cracked or lifted off the die pad. It is believed that the internal mechanical stress due to stamping and coining cause the die pad to expand and/or contract and thereby break the die away from the die pad. In contrast, the invention does not coin or stamp the die pad and so there are no unwanted stresses in the die pad. Lift off of the die from the die pad is virtually eliminated when the invention is used.

Prior art dual gauge lead frames experience problems when the tie bars are cut away from the die pad. Because the tie bars are thicker than the die pad, the step of cutting the tie bar imposes torsion forces on the die pad. Because the die pad is thinner than the tie bars, the die pad tends to twist and the twisting action may crack the die pad or detach the die from the die pad or both. In contrast, the single gauge lead frame of the invention does not have such torsion forces and twisting because all portions of the lead frame are the same gauge.

It is more difficult to form a dual gauge lead frame than to form a single gauge lead frame. The single gauge leads frame of the invention has thinner studded edges. Thus, the invention may form more studs along an edge than the prior art can form because the studs of the invention are cut and shaped only at their tips. In contrast, the prior art studs are formed by forcing metal into a die cavity. With that technique the pitch or spacing between stud tips is limited by the support needed to keep the metal from breaking.

Another advantage of the invention is its ability to form studs on one, two or three edges with minimal complexity. Since the primary metal working process is material removal and not deformation, the inventive process does not require deep die cavities and large support regions to keep the metal from breaking. Instead, the invention removes metal to form the studs and removes more metal to prepare for the bending steps. Only the tips of the studs are worked and they are worked to a trapezoidal tip. The metal in the invention is only worked while it is in a horizontal position. In contrast, the prior art uses metal deformation to form the entire stud by extruding the metal from one plane into a plane perpendicular to the plane of the metal.

With the invention, one may easily extend the stud bumps to two or three edges and the tie bars may still be readily removed because all the elements of the lead frame have the same gauge. However, the prior art lead frame has a thicker gauge for the studded edge. That makes if very difficult to put studs on two or three edges. Remember, the prior art edges are 0.75 mm thick and so the tie bars to those edges will have similar thickness. Such thick tie bars are difficult to cut and trim.

The invention claimed is:

1. A method for packaging a semiconductor die comprising the steps of:
   providing a lead frame with a planar portion for receiving and holding the semiconductor die;
   forming one or more studs along a first edge of the planar portion of the lead frame;
   forming a groove in the surface of the planar portion disposed parallel to, and spaced apart from, the first edge;
   forming a tip with a four sided taper on the end of each of the one or more studs;
   bending the first edge around the groove to an angle with respect to the planar portion of the lead frame.

2. The method of claim 1 wherein the angle is between 84 and 90 degrees.

3. The method of claim 1 wherein the step of forming one or more studs comprises removing material from the first edge to leave the one or more studs along the edge.

4. The method of claim 1 comprising the further step of spanking the tip on each of the one or more studs.

5. The method of claim 1 wherein the step of forming a groove includes machining a v-groove into the surface of the planar portion of the lead frame.

6. The method of claim 1 further comprising
   providing a semiconductor die with a die attach surface and a ball grid array surface; and
   attaching the die attach surface of the semiconductor die to the planar portion of the lead frame so that the ball grid array faces away from the planar portion of the lead frame;
   wherein the groove is formed and the first edge of the lead frame is bent such that the tip on each of the one or more studs is coplanar with the array of balls disposed on the surface of the semiconductor die.

7. The method of claim 1 comprising the further steps of:
   providing a semiconductor die with only one terminal on one surface and one or more terminals on its other surface;
   forming a planar contact on the surface with only one terminal and forming a ball grid array of contacts on the other surface; and
   attaching the planar contact of the semiconductor die to the planar portion of the lead frame;
   wherein the groove is formed and the first edge of the lead frame is bent such that the tip on each of the one or more studs is coplanar with the ball grid array.

8. The method of claim 7 wherein the semiconductor die is a mosfet and the surface with only one terminal carries a drain terminal and the other surface carries source and gate terminals.

9. The method of claim 1 further comprising:
forming one or more studs along a second edge of the planar portion of the lead frame;
forming a second groove in the surface of the planar portion disposed parallel to, and spaced apart from, the second edge; and
bending the second edge to an angle with respect to the planar portion of the lead frame.

10. The method of claim 9 further comprising:
forming one or more studs along a third edge of the planar portion of the lead frame;
forming a third groove in the surface of the planar portion disposed parallel to, and spaced apart from, the third edge; and
bending the third edge to an angle with respect to the planar portion of the lead frame.

11. A flip chip packaged semiconductor device comprising:
a die attach pad comprising a planar portion for receiving a semiconductor die;
an adhesive or solder layer on the planar portion for holding a semiconductor die;
a semiconductor die having one surface facing and attached to the planar portion of the die attach pad by the adhesive or solder;
a wall along one edge of the die attach pad disposed transverse to the die attach pad; and
a plurality of studs extending from the wall and spaced from each other;
wherein the ends of the stubs have four sided trapezoidal tapered tips.

12. The flip chip packaged semiconductor device of claim 11 wherein the semiconductor further comprises an array of bumps or balls on a surface opposite the surface facing the planar portion of the die attach pad.

13. The flip chip packaged semiconductor device of claim 11 wherein the tips of the studs and the tips of the bumps or balls lie in a common plane.

14. The flip chip packaged semiconductor device of claim 11 wherein the die attach pad and walls are formed from a sheet of copper or copper alloy.

15. A flip chip packaged semiconductor device comprising:
a die attach pad comprising a planar portion for receiving a semiconductor die and by one or more edges;
an adhesive or solder layer on the planar portion for holding a semiconductor die;
a semiconductor die having one surface attached to the planar portion of the die attach pad by adhesive or solder and another surface with bump or ball contacts;
one or more walls, each wall along an edge of the die attach pad and disposed transverse to the die attach pad; and
a plurality of spaced apart studs extending from each of the one or more walls;
wherein the ends of each of the plurality of studs have a four sided trapezoidal tapered tip.

16. The flip chip packaged semiconductor of claim 15 wherein the die attach pad has four edges and at least one wall with studs.

17. The flip chip packaged semiconductor of claim 15 wherein the die attach pad has four edges and at least two walls with studs.

18. The flip chip packaged semiconductor of claim 15 wherein the die attach pad has four edges and at least three walls with studs.

19. The flip chip packaged semiconductor of claim 15 wherein the tops of the studs are substantially coplanar with the bump or ball contacts.

20. The flip chip packaged semiconductor of claim 15 wherein a junction of the base of each of the one or more walls and the die attach pad is defined by a groove of removed die attach material.

21. The flip chip packaged semiconductor of claim 15 wherein each of the walls is bent about an axis defined by the groove associated with the respective wall.

22. The flip chip packaged semiconductor of claim 15 wherein the die attach pad and the one or more walls comprise a common material and the junction of the base of the one or more walls and the die attach pad is further defined by a bend in the common material.

23. A method for packaging a semiconductor die comprising the steps of:
providing a lead frame with a planar die attach pad for receiving and holding the semiconductor die;
punching studs into one or more edges of the die attach pad to form one or more studs projecting from each punched edge;
cutting a groove in the surface of the die attach pad proximate to each punched edge; and
bending each punched edge about its respective cut groove in a direction toward the groove to dispose the punched edge with studs at an angle with respect to the die attach pad in two separate steps.

24. The method of claim 23 further comprising the steps of:
providing a semiconductor die with one surface planar with a planar contact and an opposite surface with bump contacts;
attaching the planar surface of the semiconductor die to the planar die attach pad; and
bending each punched edge with studs about an axis parallel to its respective groove until the ends of the studs are coplanar with the tip of the bumps of the semiconductor surface.

25. A method for packaging a semiconductor die comprising the steps of:
providing a lead frame with a planar portion for receiving and holding the semiconductor die;
forming studs along one edge of the planar portion of the lead frame;
forming a groove in the surface of the planar portion disposed parallel to the edge with studs and spaced from the studs;
bending the edge with studs around the groove to an angle with respect to the planar portion of the lead frame; and
spanking the ends of the studs.

26. The method of claim 25 further comprising the steps of:
providing a semiconductor die with one surface planar with a planar contact and an opposite surface with bump contacts;
attaching the planar surface of the semiconductor die to the planar die attach pad; and
bending each punched edge with studs about an axis parallel to its respective groove until the ends of the studs are coplanar with the bumps of the semiconductor surface.

* * * * *